US011984909B2

(12) United States Patent
Asakawa et al.

(10) Patent No.: US 11,984,909 B2
(45) Date of Patent: May 14, 2024

(54) INTERCONNECTED INVERTER AND METHOD OF MANUFACTURING INTERCONNECTED INVERTER

(71) Applicant: TOYOTA JIDOSHA KABUSHIKI KAISHA, Aichi-ken (JP)

(72) Inventors: Kojiro Asakawa, Toyota (JP); Kazuhito Hayashi, Toyota (JP); Ikuhiro Nakamura, Nisshin (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 181 days.

(21) Appl. No.: 17/690,008

(22) Filed: Mar. 9, 2022

(65) Prior Publication Data
US 2022/0294464 A1 Sep. 15, 2022

(30) Foreign Application Priority Data

Mar. 12, 2021 (JP) .................. 2021-040343

(51) Int. Cl.
H03M 1/64 (2006.01)
H02J 3/40 (2006.01)
H02M 7/48 (2007.01)
H02P 27/06 (2006.01)

(52) U.S. Cl.
CPC .............. H03M 1/645 (2013.01); H02J 3/40 (2013.01); H02M 7/48 (2013.01); H02P 27/06 (2013.01)

(58) Field of Classification Search
CPC .......... H03M 1/645; H02M 7/42; H02M 7/48; H02M 7/493
See application file for complete search history.

(56) References Cited

U.S. PATENT DOCUMENTS

| 4,720,776 | A | * | 1/1988 | Guyeska | ............. | H02M 5/4505 |
| | | | | | | 363/138 |
| 11,479,291 | B2 | * | 10/2022 | Endoh | .................... | B62D 5/046 |
| 2010/0052958 | A1 | * | 3/2010 | Roeven | ................. | H03M 1/186 |
| | | | | | | 341/139 |
| 2018/0339724 | A1 | * | 11/2018 | Nishikawa | .......... | H02M 7/5395 |
| 2020/0207406 | A1 | * | 7/2020 | Endoh | ................. | B62D 5/0481 |

FOREIGN PATENT DOCUMENTS

| JP | H921176 A | 10/1997 |
| JP | H9271176 A | 10/1997 |

* cited by examiner

Primary Examiner — Lam T Mai
(74) Attorney, Agent, or Firm — HAUPTMAN HAM, LLP

(57) ABSTRACT

A system of an interconnected inverter includes an inverter that converts DC power from a DC power supply into AC power and provides AC power to an AC power line, an RDC that converts a voltage value obtained by a voltage sensor into electrical angle information that shows a phase angle of an output voltage, the voltage sensor obtaining a voltage value of an output voltage from the inverter to a power grid, and an ECU that controls the inverter to provide an alternating current in synchronization with an alternating current that flows through the AC power line by using timing at which an angle shown in the electrical angle information given from the RDC attains to a prescribed angle. Extra cost for diversion can be reduced.

6 Claims, 6 Drawing Sheets

INTERCONNECTED INVERTER AND METHOD OF MANUFACTURING INTERCONNECTED INVERTER

This nonprovisional application is based on Japanese Patent Application No. 2021-040343 filed with the Japan Patent Office on Mar. 12, 2021, the entire contents of which are hereby incorporated by reference.

BACKGROUND

Field

This disclosure relates to an interconnected inverter and a method of manufacturing an interconnected inverter, and particularly to an interconnected inverter suitable for interconnecting direct-current (DC) power to a power line for alternating-current (AC) power and a method of manufacturing the interconnected inverter.

Description of the Background Art

A grid-connected inverter that converts DC power into AC power in synchronization with an AC voltage of an AC power grid has conventionally been known (see, Japanese Patent Laying-Open No. 9-271176). Such a grid-connected inverter includes an A/D port for receiving a voltage sensor value for synchronization with a three-phase AC voltage at a network connection point on a grid side.

SUMMARY

An inverter mounted on a vehicle, however, generally does not include an A/D port for receiving a voltage sensor value. Therefore, when an attempt to divert a vehicle-mounted inverter to a grid-connected inverter is made, an A/D port should newly be provided. Therefore, such diversion disadvantageously requires extra cost.

This disclosure was made to solve the problem described above, and an object thereof is to provide an interconnected inverter capable of achieving reduction in extra cost required for diversion and a method of manufacturing the interconnected inverter.

An interconnected inverter according to this disclosure includes an inverter circuit that converts DC power from a DC power supply into AC power and provides AC power to an AC power line, a resolver digital converter that converts a voltage value obtained by a voltage sensor into electrical angle information that shows a phase angle of an output voltage from the inverter to the AC power line, the voltage sensor obtaining the voltage value of the output voltage, and a control unit that controls the inverter circuit to provide an alternating current in synchronization with an alternating current that flows through the AC power line by using timing at which an angle shown in the electrical angle information given from the resolver digital converter attains to a prescribed angle.

According to such a configuration, when a voltage value of AC power in the AC power line obtained by the voltage sensor is provided to the resolver digital converter, an electrical angle of AC power and an electrical angle provided from the resolver digital converter are in synchronization with each other at a specific angle. When a frequency of AC power in the AC power line has already been known (for example, 50 Hz or 60 Hz) and when synchronization is achieved at the specific angle, output from the inverter circuit and AC power in the AC power line can be in synchronization with each other. Thus, an A/D port for receiving a voltage value from the voltage sensor does not have to newly be provided. Consequently, extra cost required for diversion can be reduced.

The inverter circuit, the resolver digital converter, and the control unit may be diverted from a system for driving a motor. The system for driving a motor may be a vehicle. Consequently, cost can be reduced by diversion.

The AC power line may be a three-phase AC power line. The control unit may control the inverter circuit to provide AC power in synchronization with AC power that flows through the AC power line by using timing at which an angle shown in the electrical angle information given from the resolver digital converter attains to 0 degree or ±180 degrees. When AC power is three-phase AC power, the resolver digital converter provides a signal in synchronization at the timing at which 0 degree or ±180 degrees of the electrical angle (voltage phase) of AC power is attained. Therefore, synchronization can accurately be achieved by using such timing. The AC power line may be a single-phase AC power line.

According to another aspect of this disclosure, a method of manufacturing an interconnected inverter is a method of diverting a resolver digital converter, an inverter circuit, and a control unit mounted on a system including an inverter circuit that converts DC power from a DC power supply into AC power, a motor that generates driving force by using AC power from the inverter circuit, a resolver that detects a value relating to rotation of the motor, a resolver digital converter that converts a value from the resolver into electrical angle information that shows a phase angle relating to rotation, and a control unit that controls the inverter circuit by using an angle shown in the electrical angle information given from the resolver digital converter.

The method of manufacturing an interconnected inverter includes providing a terminal for connection to a DC power supply, of input of DC power to the inverter circuit, providing a terminal for connection to an AC power line, of output from the inverter circuit connected to the motor, providing a terminal for connection of a signal line from a voltage sensor to the resolver digital converter, the voltage sensor obtaining a voltage value of an output voltage to the AC power line, and modifying a method of control by the control unit to control the inverter circuit to provide an alternating current in synchronization with an alternating current that flows through the AC power line by using timing at which an angle shown in the electrical angle information given from the resolver digital converter attains to a prescribed angle. According to such a configuration, extra cost required for diversion can be reduced.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
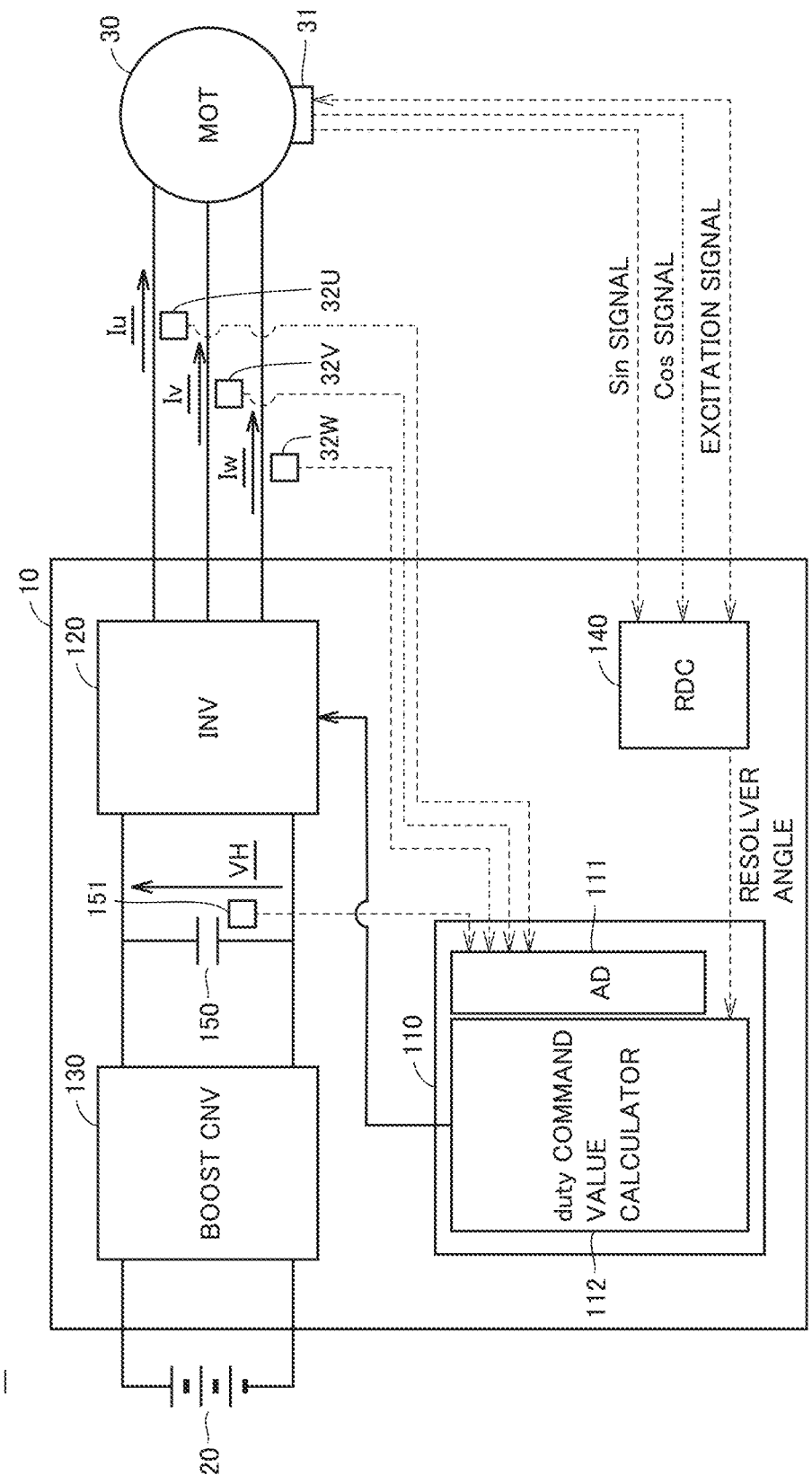
FIG. 1 is a diagram showing overview of a configuration of a system around an inverter as being mounted on a vehicle in this embodiment.

An embodiment of this disclosure will be described below with reference to the drawings. In the description below, the same elements have the same reference characters allotted and their labels and functions are also the same. Therefore, detailed description thereof will not be repeated.

First Embodiment

FIG. 1 is a diagram showing overview of a configuration of a system around an inverter as being mounted on a vehicle in this embodiment. Referring to FIG. 1, a vehicle 1 includes a power control unit (PCU) 10, a power storage device 20, a motor generator 30, a resolver 31, and current sensors 32U, 32V, and 32W. PCU 10 includes an electronic control unit (ECU) 110, an inverter 120, a boost converter 130, a resolver digital converter (which will be denoted as an "RDC" below) 140, a capacitor 150, and a voltage sensor 151. ECU 110 includes an analog-digital conversion circuit 111 and a duty command value calculator 112 in addition to a central processing unit (CPU) (not shown) and a memory (not shown).

Power storage device 20 includes a battery assembly including a plurality of cells. Each cell is a secondary battery such as a lithium ion battery or a nickel metal hydride battery. Power storage device 20 supplies electric power for generating driving force of vehicle 1 to motor generator 30, and electric power generated by motor generator 30 is stored in power storage device 20.

Boost converter 130 boosts a voltage applied to inverter 120 by power storage device 20 and lowers a voltage for charging of power storage device 20 from inverter 120. Capacitor 150 smoothens the voltage boosted by boost converter 130. Voltage sensor 151 detects a voltage VH across opposing terminals of capacitor 150 and provides an analog signal representing detected voltage VH.

Inverter 120 converts DC power from boost converter 130 into AC power for output in accordance with a control signal from ECU 110 and supplies AC power to motor generator 30, and it converts AC power regenerated by motor generator 30 into DC power and supplies DC power to power storage device 20 through boost converter 130.

Motor generator 30 drives wheels of vehicle 1 by rotating in accordance with AC power supplied from inverter 120, and it supplies to inverter 120, AC power regenerated by regeneration of deceleration force from the wheels.

Resolver 31 is an angle sensor that provides an angle of rotation of a rotor as two-phase AC voltages (analog signals), and includes an excitation coil, a rotor including a repeating coil, and two-phase output coils arranged to form an angle of 90 degrees with respect to each other with a rotation shaft of the rotor being defined as the center. In carrying out this, the rotor of resolver 31 is connected to a rotation shaft of motor generator 30, and hence resolver 31 functions as an angle sensor for motor generator 30.

When an excitation signal is applied to a primary-side excitation coil in resolver 31, the rotor connected to the shaft of motor generator 30 rotates, and the excitation signal generates induced electromotive force in the repeating coil of the rotating rotor. Induced electromotive force in the repeating coil generates induced electromotive force in the output coils, so that a sin signal and a cos signal corresponding to the angle of the rotor are provided from the two-phase output coils on a secondary side.

Figure 2:
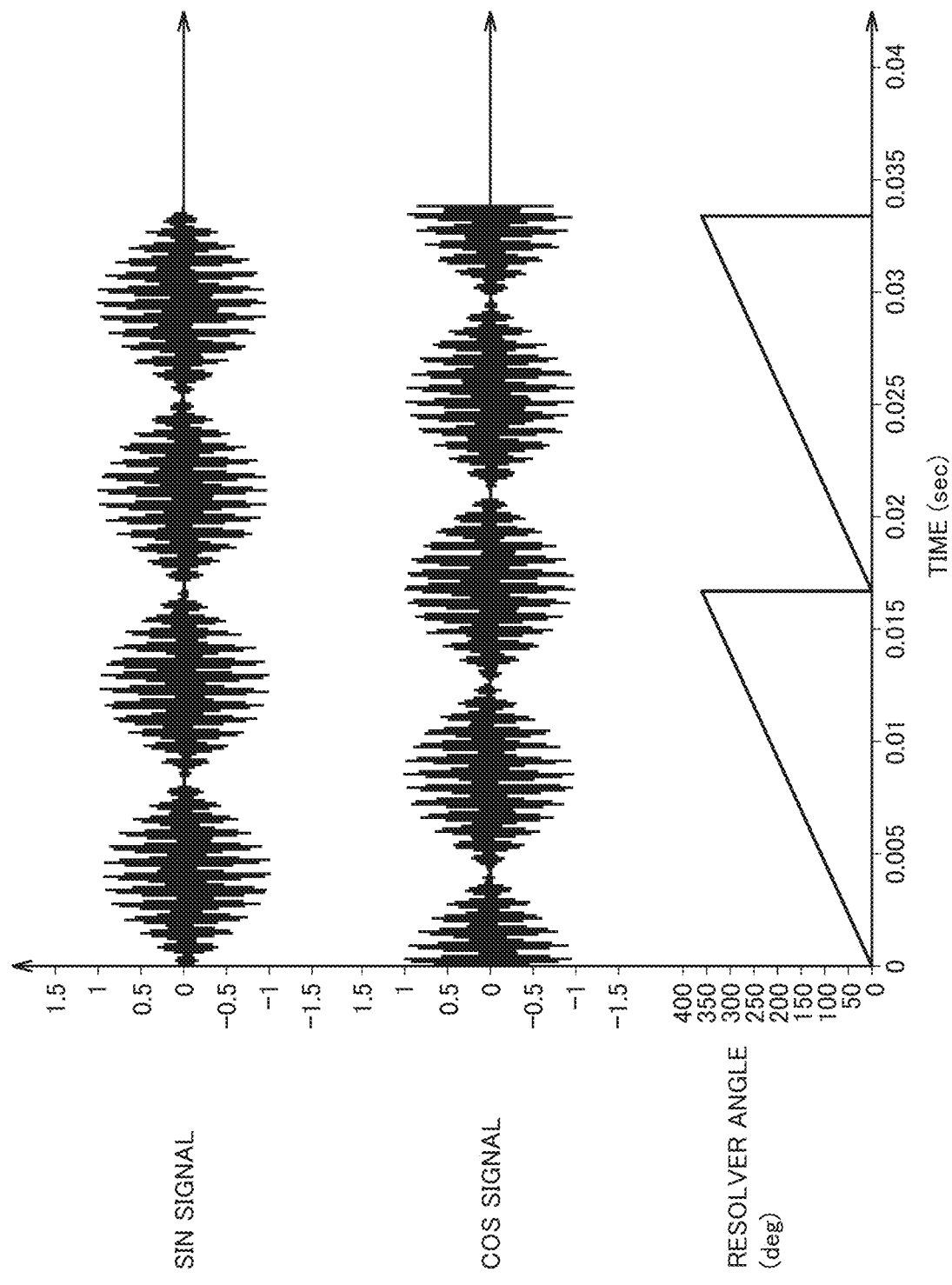
FIG. 2 shows a graph of a sin signal and a cos signal provided from a resolver in this embodiment and an angle of rotation obtained therefrom.

FIG. 2 shows a graph of a sin signal and a cos signal provided from resolver 31 in this embodiment and an angle of rotation obtained therefrom. Referring to FIG. 2, a graph in a first row shows variation in sin signal, a graph in a second row shows variation in cos signal, and a graph in a third row shows an angle of rotation. In the graph in the first row in FIG. 2, a line showing an amplitude of a waveform draws a sine curve. In the graph in the second row in FIG. 2, a line showing an amplitude of a waveform draws a cosine curve.

Referring back to FIG. 1, RDC 140 is an integrated circuit (IC) that calculates an angle of rotation (which is referred to as a "resolver angle" below) of the rotor of resolver 31 by using a signal provided from resolver 31 and provides a digital signal representing the angle of rotation. Since the rotor of resolver 31 is connected to the rotation shaft of motor generator 30 in this embodiment, RDC 140 calculates the angle of rotation of motor generator 30.

Referring again to FIG. 2, the graph in the third row shows variation in resolver angle calculated by RDC 140. A point where a value of the sine curve shown in the graph in the first row is 0 is calculated as points of 0 degree, 180 degrees, and 360 degrees of the resolver angle, and a point where a value of the cosine curve shown in the graph in the second row is 0 is calculated as points of 90 degrees and 270 degrees of the resolver angle.

Referring back to FIG. 1, current sensors 32U, 32V, and 32W detect currents Iu, Iv, and Iw of the U phase, the V phase, and the W phase of the three-phase alternating current that flows between inverter 120 and motor generator 30, and provide analog signals representing detected currents Iu, Iv, and Iw, respectively.

Analog-digital conversion circuit 111 converts analog signals provided from voltage sensor 151 and current sensors 32U, 32V, and 32W into digital signals.

Duty command value calculator 112 is a component that is virtually implemented in ECU 110 by execution by the CPU of ECU 110, of a program stored in the memory. Duty command value calculator 112 calculates a duty command value for controlling inverter 120 such that motor generator 30 generates driving force in accordance with an operation onto an accelerator by a driver of vehicle 1, by using the resolver angle shown in the signal provided from RDC 140, voltage VH shown in the signal from voltage sensor 151, and currents Iu, Iv, and Iw shown in respective signals from current sensors 32U, 32V, and 32W, and provides the calculated duty command value to inverter 120.

A grid-connected inverter that converts DC power into AC power in synchronization with an AC voltage of an AC power grid has conventionally been known. Such a grid-connected inverter includes an A/D port for receiving a voltage sensor value for synchronization with a three-phase AC voltage at a network connection point on a grid side.

ECU 110 that controls inverter 120 mounted on vehicle 1 described above, however, generally does not include an A/D port for receiving a voltage sensor value. Therefore, when an attempt to divert vehicle-mounted inverter 120 to a grid-connected inverter is made, an A/D port should newly be provided. Therefore, such diversion disadvantageously requires extra cost.

When RDC 140 is not diverted, software for calculation of a voltage phase may be added to ECU 110 or hardware for calculation of a voltage phase may separately be provided. Therefore, time and efforts for adaptation of software or addition of hardware (adaptation of a control substrate of ECU 110) are disadvantageously required.

Then, in this disclosure, the system of the inverter for the grid-connection application diverted from the inverter mounted on vehicle 1 includes inverter 120 that converts DC power from a DC power supply into AC power and provides AC power to an AC power line, RDC 140 that converts a voltage value obtained by a voltage sensor into electrical angle information that shows a phase angle of an output voltage, the voltage sensor obtaining a voltage value of an output voltage from inverter 120 to the AC power line, and ECU 110 that controls the inverter circuit to provide an alternating current in synchronization with an alternating current that flows through the AC power line by using timing at which an angle shown in the electrical angle information given from RDC 140 attains to a prescribed angle.

An A/D port that receives a voltage value from a voltage sensor thus does not have to newly be provided. Time and efforts for providing software or hardware in place of RDC 140 can be obviated. Consequently, extra cost and time and efforts required for diversion can be reduced.

Figure 3:
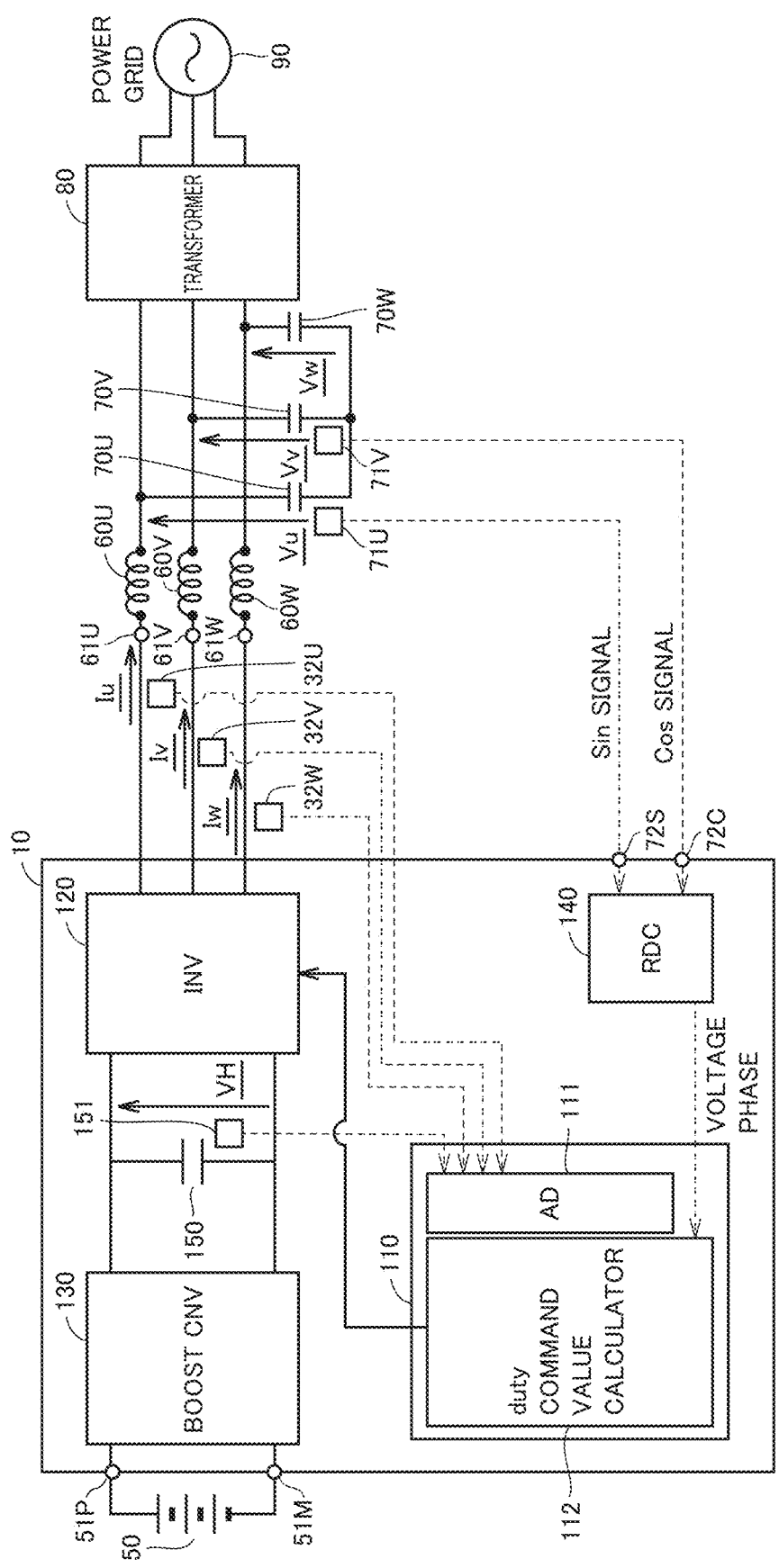
FIG. 3 is a diagram showing overview of a configuration of the system around the inverter after diversion from a vehicle-mount application to a grid-connection application in a first embodiment.

FIG. 3 is a diagram showing overview of a configuration of the system around the inverter after diversion from the vehicle-mount application to the grid-connection application in the first embodiment. Referring to FIG. 3, since the inside of PCU 10 and current sensors 32U, 32V, and 32W of the system for the grid-connection application are similar to those of the system for the vehicle-mount application shown in FIG. 1, redundant description will not be repeated.

Initially, in the system for the grid-connection application, in addition to the system for the vehicle-mount application, terminals 51P and 51M are provided on a battery side of boost converter 130, terminals 61U, 61V, and 61W are provided in respective three-phase electrical wires on an output side of inverter 120, and terminals 72S and 72C are provided in respective lines of RDC 140 for input of the sin signal and the cos signal.

A transformer 80 that transforms a voltage of inverter 120 into a voltage of a power grid 90 is connected to power grid 90. On a side of transformer 80 opposite to power grid 90, LC filters for three phases implemented by coils 60U, 60V, and 60W and capacitors 70U, 70V, and 70W are connected. The LC filter removes a high-frequency component of the three-phase alternating current from inverter 120. Terminals 61U, 61V, and 61W are connected to a side opposite to transformer 80, of respective coils 60U, 60V, and 60W of the LC filters. Voltage sensors 71U and 71V detect voltages Vu and Vv across opposing terminals of capacitors 70U and 70V of the LC filters and provide analog signals representing detected voltages Vu and Vv, respectively.

In diversion to the system for the grid-connection application, battery 50 such as a primary battery, a secondary battery, a solar cell, and a fuel cell is connected to terminals 51P and 51M, the side opposite to transformer 80, of coils 60U, 60V, and 60W is connected to terminals 61U, 61V, and 61W, and signal lines from voltage sensors 71U and 71V are connected to respective terminals 72S and 72C. Instead of battery 50, a capacitor may be connected to terminals 51P and 51M.

A voltage signal of the U phase and a voltage signal of the V phase of the three-phase alternating current of power grid 90 are thus provided to RDC 140 instead of the sin signal and the cos signal originally provided to RDC 140.

Figure 4:
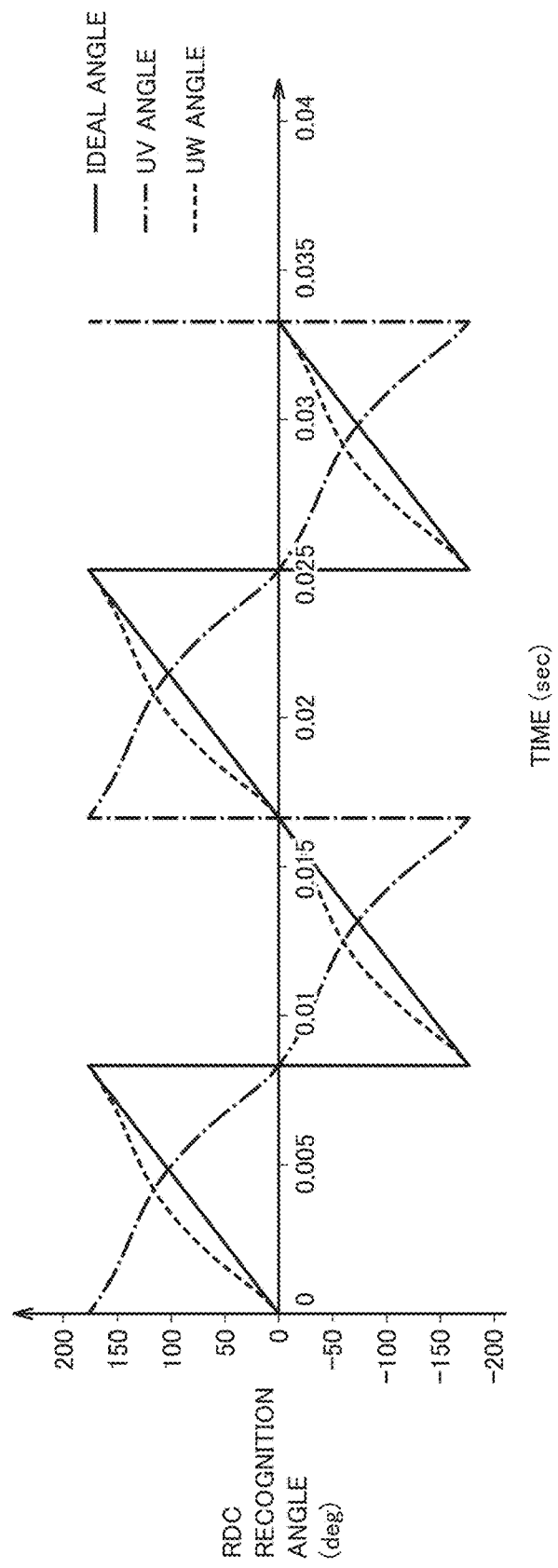
FIG. 4 shows a graph of a signal provided when voltages of two phases of a three-phase alternating current are provided to an RDC in the first embodiment.

FIG. 4 shows a graph of signals provided when voltages of two phases of the three-phase alternating current are provided to RDC 140 in the first embodiment. Referring to FIG. 4, when the sin signal and the cos signal from resolver 31 of motor generator 30 are provided to RDC 140 as shown in FIG. 1, a signal shown in the graph as the ideal angle in FIG. 4 similar to the waveform in the graph in the third row in FIG. 2 is provided from RDC 140 to duty command value calculator 112.

When the voltage signal of the U phase and the voltage signal of the V phase of the three-phase alternating current of power grid 90 are provided to RDC 140 as in FIG. 3, a signal shown in the graph as a UV angle in FIG. 4 is provided from RDC 140 to duty command value calculator 112.

When the voltage signal of the U phase and the voltage signal of the W phase of the three-phase alternating current of power grid 90 are provided to RDC 140, a signal shown in the graph as a UW angle in FIG. 4 is provided from RDC 140 to duty command value calculator 112.

Duty command value calculator 112 can detect timing at which the phase of the three-phase alternating current of power grid 90 attains to 0 degree or ±180 degrees, from variation in output signal representing the UV angle or output signal representing the UW angle as such. Since a time period for one cycle can thus be calculated, an angular velocity of variation in voltage phase can be calculated. Since the frequency of the three-phase alternating current of power grid 90 has already been known (for example, 50 Hz or 60 Hz in Japan), duty command value calculator 112 can generate a duty command value for output of the three-phase alternating current of the voltage phase in synchronization with the three-phase alternating current of power grid 90 and provide the duty command value to inverter 120.

In order to provide such a duty command value, software for implementing duty command value calculator 112 may be modified. Specifically, software as being mounted on the vehicle is configured to calculate a duty command value for controlling inverter 120 such that motor generator 30 generates driving force in accordance with an operation onto an accelerator by a driver of vehicle 1 by using the resolver angle shown in the signal provided from RDC 140, voltage VH shown in the signal from voltage sensor 151, and currents Iu, Iv, and Iw shown in respective signals from current sensors 32U, 32V, and 32W and to provide the calculated duty command value to inverter 120.

The thus configured software as being mounted on the vehicle is modified to specify timing at which the three-phase alternating current of power grid 90 attains to 0 degree or ±180 degrees by using a voltage phase angle shown in the signal provided from RDC 140, voltage VH shown in the signal from voltage sensor 151, and currents Iu, Iv, and Iw shown in respective signals from current sensors 32U, 32V, and 32W, to calculate a duty command value for control of inverter 120 to generate the three-phase alternating current the same in voltage phase as the three-phase alternating current of power grid 90 as being synchronized with this timing, and to provide the calculated duty command value to inverter 120.

Second Embodiment

In the first embodiment, diversion of the system around the vehicle-mounted inverter to the system for grid interconnection to three-phase AC power grid 90 is described. In a second embodiment, diversion of the system around the vehicle-mounted inverter to a system for grid interconnection to single-phase AC power grids 91 and 92 will be described.

Figure 5:
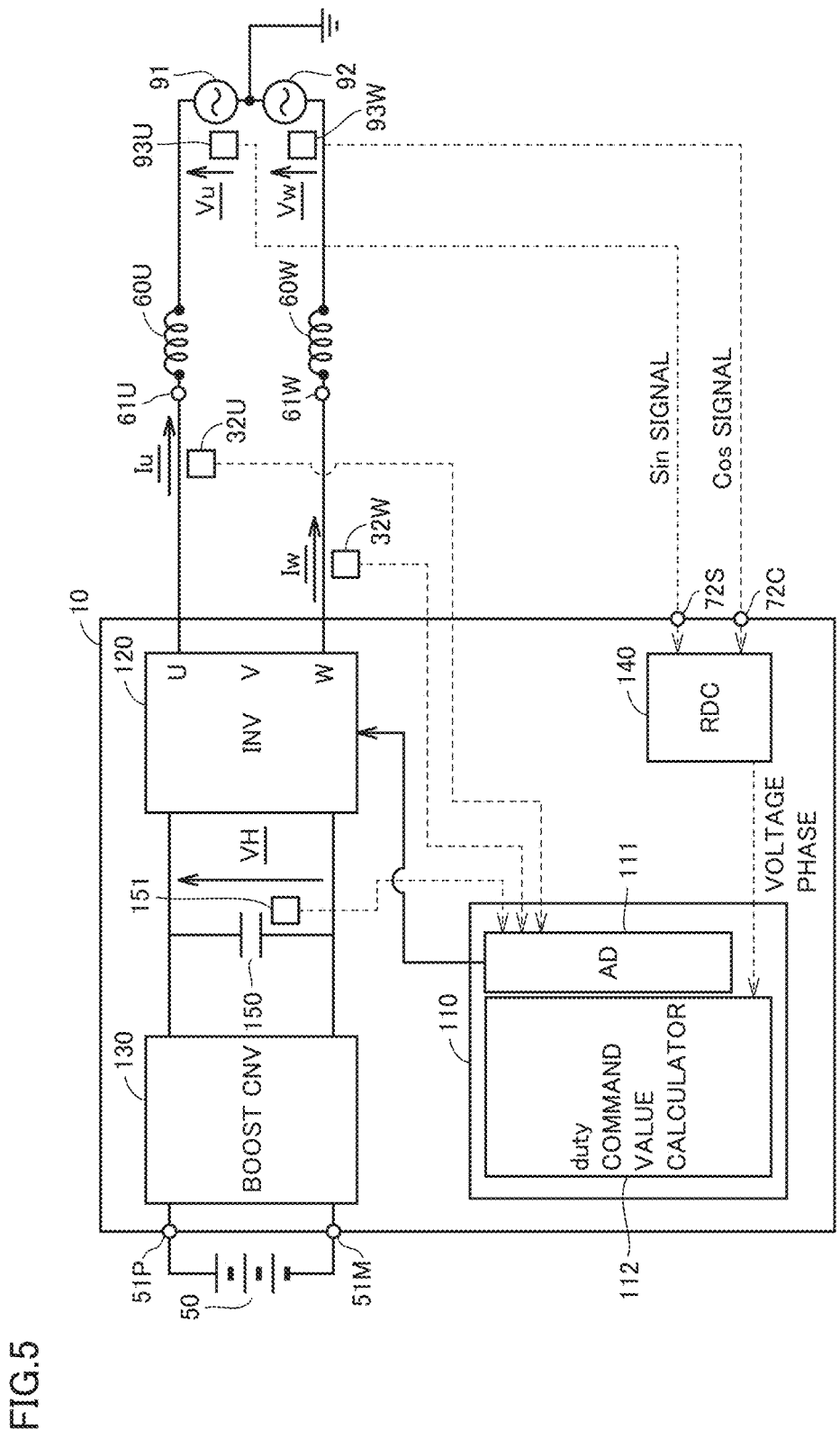
FIG. 5 is a diagram showing overview of a configuration of the system around the inverter after diversion from the vehicle-mount application to the grid-connection application in a second embodiment.

FIG. 5 is a diagram showing overview of a configuration of the system around the inverter after diversion from the vehicle-mount application to the grid-connection application in the second embodiment. Referring to FIG. 5, since the inside of PCU 10 and current sensors 32U and 32W of the system for the grid-connection application are similar to those of the system for the vehicle-mount application shown in FIG. 1, redundant description will not be repeated. Since terminals 51P, 51M, 61U, 61W, 72S, and 72C and coils 60U and 60W of the system for a single-phase AC grid connection application are similar to those of the system for a three-phase AC grid connection application shown in FIG. 3, redundant description will not be repeated.

Though single-phase alternating current of a single-phase three-wire system is described with reference to FIG. 5, single-phase alternating current of a single-phase two-wire system is also similarly applicable by removing a portion associated with the W phase and containing only a portion associated with the U phase in FIG. 5.

The system for the single-phase AC grid connection application is interconnected to a single-phase AC power grid 91 of a first phase of the single-phase three-wire system and a single-phase AC power grid 92 of a second phase reverse in phase to the first phase, rather than three-phase AC power grid 90 of the system for the three-phase AC grid connection application. Voltage sensors 93U and 93W detect voltages Vu and Vw of power grids 91 and 92 and provides analog signals representing detected voltages Vu and Vw, respectively.

Coils 60U and 60W are connected to respective power grids 91 and 92 on a side opposite to the ground. Coils 60U and 60W remove a high-frequency component of alternating current from inverter 120. Terminals 61U and 61W are connected to a side of coils 60U and 60W opposite to power grids 91 and 92, respectively.

In diversion to the system for the grid-connection application, battery 50 such as a primary battery, a secondary battery, a solar cell, and a fuel cell is connected to terminals 51P and 51M, the side opposite to power grids 91 and 92, of coils 60U and 60W is connected to terminals 61U and 61W, and signal lines from voltage sensors 93U and 93W are connected to respective terminals 72S and 72C.

Voltage signals of single-phase alternating currents of power grids 91 and 92 are thus provided to RDC 140 instead of the sin signal and the cos signal originally provided to RDC 140.

Figure 6:
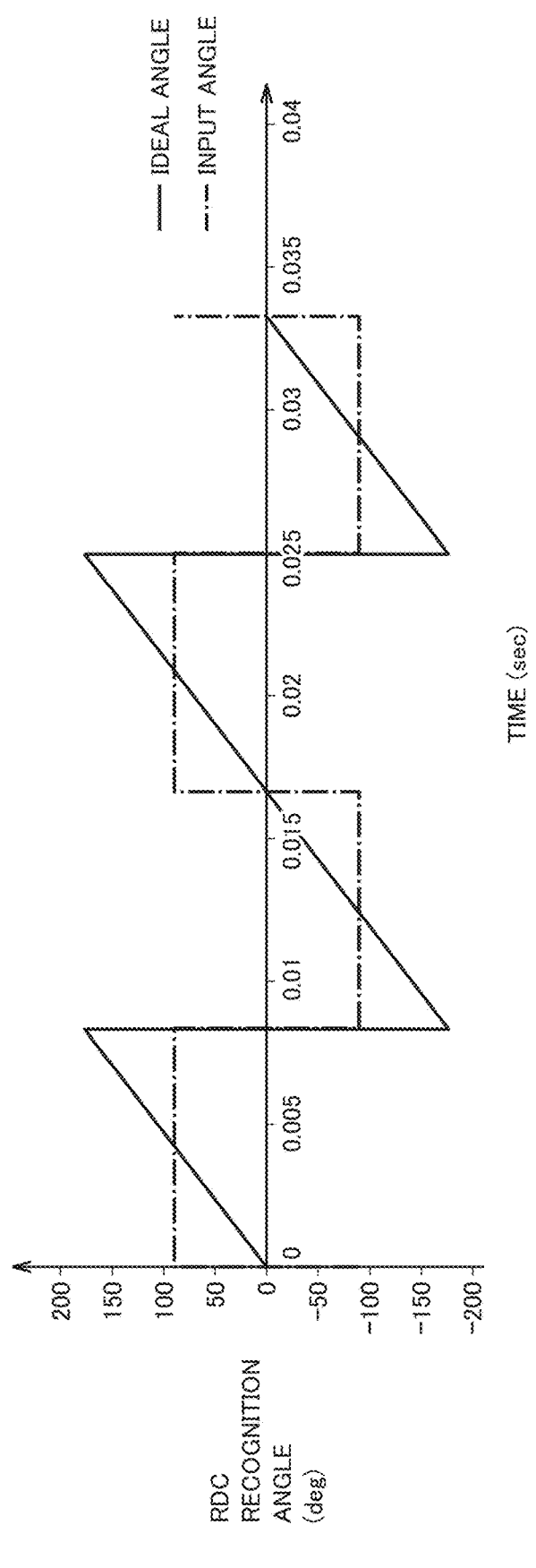
FIG. 6 shows a graph of a signal provided when voltages of two single-phase alternating currents reverse in phase to each other are provided to the RDC in the second embodiment.

FIG. 6 shows a graph of signals provided at the time when voltages of two single-phase alternating currents reverse in phase to each other are provided to RDC 140 in the second embodiment. Referring to FIG. 6, when the sin signal and the cos signal from resolver 31 of motor generator 30 are provided to RDC 140 as shown in FIG. 1, the signal shown in the graph as the ideal angle in FIG. 6 similar to the waveform shown in the graph in the third row in FIG. 2 is provided from RDC 140 to duty command value calculator 112.

When voltage signals of single-phase alternating currents reverse in phase to each other of power grids 91 and 92 are provided to RDC 140 as in FIG. 5, a signal shown in the graph as an input angle in FIG. 6 is provided from RDC 140 to duty command value calculator 112.

Duty command value calculator 112 can detect timing at which the phases of the single-phase alternating currents of power grids 91 and 92 attain to 90 degrees or −90 degrees, from such variation in signal representing the input angle. Since a time period for one cycle can thus be calculated, an angular velocity of variation in voltage phase can be calculated. Since the frequency of the single-phase alternating currents of power grids 91 and 92 has already been known (for example, 50 Hz or 60 Hz in Japan), duty command value calculator 112 can generate a duty command value for output of the single-phase alternating current of the voltage phase in synchronization with the single-phase alternating currents of power grids 91 and 92 and provide the duty command value to inverter 120.

In order to provide such a duty command value, software for implementing duty command value calculator 112 may be modified. Specifically, software as being mounted on the vehicle is configured to calculate a duty command value for controlling inverter 120 such that motor generator 30 generates driving force in accordance with an operation onto an accelerator by a driver of vehicle 1 by using the resolver angle shown in the signal provided from RDC 140, voltage VH shown in the signal from voltage sensor 151, and currents Iu and Iw shown in respective signals from current sensors 32U and 32W and to provide the calculated duty command value to inverter 120.

The thus configured software as being mounted on the vehicle is modified to specify timing at which the single-phase alternating currents of power grids 91 and 92 attain to 90 degrees or −90 degrees by using a voltage phase angle shown in the signal provided from RDC 140, voltage VH shown in the signal from voltage sensor 151, and currents Iu and Iw shown in respective signals from current sensors 32U and 32W, to calculate a duty command value for control of inverter 120 to generate the single-phase alternating current the same in voltage phase as the single-phase alternating current of power grid 91 or 92 as being synchronized with this timing, and to provide the calculated duty command value to inverter 120.

[Modification]

(1) In the embodiments described previously, as shown in FIG. 1, motor generator 30 performs a power generation function. Alternatively, a motor without the power generation function may be applicable.

(2) In the embodiments described previously, as shown in FIG. 1, diversion of the system of the inverter of motor generator 30 mounted on vehicle 1 is described. Without being limited as such, a system of an inverter of a motor mounted on an apparatus different from vehicle 1 may be diverted.

(3) In the first embodiment described previously, as shown in FIG. 3, signals representing voltages Vu and Vv of the U phase and the V phase of the three-phase alternating current are provided to RDC 140. Without being limited as such, signals provided to RDC 140 may be signals representing voltages Vv and Vw of the V phase and the W phase of the three-phase alternating current or signals representing voltages Vw and Vu of the W phase and the U phase of the three-phase alternating current.

(4) In the second embodiment described previously, as shown in FIG. 5, the single-phase alternating current of the single-phase three-wire system is described. Without being limited as such, the second embodiment can also similarly be applied to the single-phase alternating current of the single-phase two-wire system by removing a portion associated with the W phase and containing only a portion associated with the U phase or removing the portion associated with the U phase and containing only a portion associated with the W phase in FIG. 5.

(5) In the embodiments described previously, as shown in FIGS. 3 and 5, interconnection to power grid(s) 90, 91, and/or 92 is described. Without being limited as such, alternating current may be provided from inverter 120 to a power line independent of the power grid.

(6) In the embodiments described previously, as shown in FIGS. 3 and 5, conversion of DC power in battery 50 into AC power by inverter 120 diverted from the vehicle-mount application and supply of AC power to AC power line(s) of power grid(s) 90, 91, and/or 92 are described. Without being limited as such, AC power in the AC power line may be converted to DC power by inverter 120 diverted from the vehicle-mount application and battery 50 may be charged with resultant DC power.

(7) The embodiments described previously may be understood as disclosure of a system of an interconnected inverter (not only an inverter interconnected to power grid(s) 90, 91, and/or 92 but also an inverter interconnected to a power line independent of the power grid) as shown in FIG. 3 or 5, as disclosure of a method of manufacturing an interconnected inverter by diverting an inverter system for the vehicle-mount application to a system of the interconnected inverter, as disclosure of a method of diverting an inverter system for the vehicle-mount application to a system of an interconnected inverter, or as disclosure of a method of interconnection to a power grid or an independent power line by means of an interconnected inverter.

SUMMARY (1) As shown in FIGS. 3 and 5, the system of the interconnected inverter includes inverter 120 that converts DC power from a DC power supply into AC power and provides AC power to an AC power line, RDC 140 that converts two voltage values (one voltage value in the case of the single-phase two-wire system) obtained by two voltage sensors (one voltage sensor in the case of the single-phase two-wire system) 71U and 71V or 93U and 93W into electrical angle information that shows a phase angle of an output voltage from inverter 120 to the AC power line(s) (for example, power grid(s) 90, 91, and/or 92), the voltage sensors obtaining two voltage values (one voltage value in the case of the single-phase two-wire system) of output voltages, and ECU 110 that controls inverter 120 to provide an alternating current in synchronization with an alternating current that flows through the AC power line by using timing at which an angle shown in the electrical angle information given from RDC 140 attains to a prescribed angle.

Thus, when voltage values of AC power in the AC power line(s) obtained by voltage sensors 71U and 71V or 93U and 93W are provided to RDC 140, an electrical angle of AC power and an electrical angle provided from RDC 140 are in synchronization with each other at a specific angle (for example, 0 degree or 180 degrees in FIG. 4 and 90 degrees or −90 degrees in FIG. 6). When a frequency of AC power in the AC power line(s) such as power grid(s) 90, 91, and/or 92 has already been known (for example, 50 Hz or 60 Hz) and when synchronization is achieved at the specific angle, output from inverter 120 and AC power in the AC power line(s) can be in synchronization with each other. Thus, A/D ports for receiving voltage values from voltage sensors 71U and 71V or 93U and 93W does not have to newly be provided. Consequently, extra cost required for diversion can be reduced.

(2) As shown in FIGS. 1, 3, and 5, inverter 120, RDC 140, and ECU 110 may be diverted from a system for driving a motor. Consequently, cost can be reduced by diversion.

(3) As shown in FIG. 1, the system for driving a motor may be vehicle 1. Consequently, cost can be reduced by diversion.

(4) As shown in FIG. 3, the AC power line may be a three-phase AC power line (for example, power grid 90).

(5) As shown in FIGS. 3 and 4, ECU 110 may control inverter 120 to provide AC power in synchronization with AC power that flows through the AC power line by using timing at which an angle shown in the electrical angle information given from RDC 140 attains to 0 degree or ±180 degrees. When AC power is three-phase AC power, RDC 140 provides a signal in synchronization at the timing at which 0 degree or ±180 degrees of the electrical angle (voltage phase) of AC power is attained. Therefore, synchronization can accurately be achieved by using such timing.

(6) As shown in FIG. 5, the AC power line may be a single-phase AC power line (for example, power grids 91 and 92).

(7) As shown in FIGS. 1, 3, and 5, a method of manufacturing an interconnected inverter is a method of diverting RDC 140, inverter 120, and ECU 110 mounted on a system including inverter 120 that converts DC power from a DC power supply (for example, power storage device 20) into AC power, motor generator 30 that generates driving force by using AC power from inverter 120, resolver 31 that detects a value relating to rotation of motor generator 30, RDC 140 that converts a value from resolver 31 into electrical angle information that shows a phase angle relating to rotation, and ECU 110 that controls inverter 120 by using the angle shown in the electrical angle information given from RDC 140.

The method of manufacturing an interconnected inverter includes providing terminals 51P and 51M for connection to a DC power supply (for example, battery 50), of input of DC power to inverter 120, providing terminals 61U, 61V, and/or 61W for connection to AC power line(s) (for example, power grid(s) 90, 91, and/or 92), of output from inverter 120 connected to motor generator 30, providing terminals 72S and 72C for connection of signal lines from two voltage sensors (one voltage sensor in the case of the single-phase two-wire system) (for example, voltage sensors 71U and 71V or 93U and 93W) to RDC 140, the voltage sensors obtaining two voltage values (one voltage value in the case of the single-phase two-wire system) of output voltages to the AC power line, and modifying a method of control by ECU 110 to control inverter 120 to provide an alternating current in synchronization with an alternating current that flows through the AC power line by using timing at which an angle shown in the electrical angle information given from RDC 140 attains to a prescribed angle. According to such a configuration, extra cost required for diversion can be reduced.

Though embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. An interconnected inverter comprising:
an inverter circuit that converts DC power from a DC power supply into AC power and provides AC power to an AC power line;
a resolver digital converter that converts a voltage value obtained by a voltage sensor into electrical angle information that shows a phase angle of an output voltage from the inverter circuit to the AC power line, the voltage sensor obtaining the voltage value of the output voltage; and
a control unit that controls the inverter circuit to provide an alternating current in synchronization with an alternating current that flows through the AC power line by using timing at which an angle shown in the electrical angle information given from the resolver digital converter attains to a prescribed angle, wherein
the control unit controls the inverter circuit to provide AC power in synchronization with AC power that flows through the AC power line by using timing at which an angle shown in the electrical angle information given from the resolver digital converter attains to 0 degree or ±180 degrees.

2. The interconnected inverter according to claim 1, wherein
the inverter circuit, the resolver digital converter, and the control unit are diverted from a system for driving a motor.

3. The interconnected inverter according to claim 2, wherein
the system for driving a motor is a vehicle.

4. The interconnected inverter according to claim 1, wherein
the AC power line is a three-phase AC power line.

5. The interconnected inverter according to claim 1, wherein
the AC power line is a single-phase AC power line.

6. A method of manufacturing an interconnected inverter, the method being a method of diverting a resolver digital converter, an inverter circuit, and a control unit mounted on a system, the system including
an inverter circuit that converts DC power from a DC power supply into AC power,
a motor that generates driving force by using AC power from the inverter circuit,
a resolver that detects a value relating to rotation of the motor,
a resolver digital converter that converts a value from the resolver into electrical angle information that shows a phase angle relating to rotation, and
a control unit that controls the inverter circuit by using an angle shown in the electrical angle information given from the resolver digital converter,
the method comprising:
providing a terminal for connection to a DC power supply, of input of DC power to the inverter circuit;
providing a terminal for connection to an AC power line, of output from the inverter circuit connected to the motor;
providing a terminal for connection of a signal line from a voltage sensor to the resolver digital converter, the voltage sensor obtaining a voltage value of an output voltage to the AC power line; and
modifying a method of control by the control unit to control the inverter circuit to provide an alternating current in synchronization with an alternating current that flows through the AC power line by using timing at which an angle shown in the electrical angle information given from the resolver digital converter attains to a prescribed angle.

* * * * *